US006526536B1

(12) United States Patent
Chen et al.

(10) Patent No.: US 6,526,536 B1
(45) Date of Patent: Feb. 25, 2003

(54) APPARATUS WITHIN AN INTEGRATED CIRCUIT FOR PREVENTING THE INTEGRATED CIRCUIT FROM ERRONEOUSLY ENTERING A TEST MODE OPERATION

(75) Inventors: Jason Chen, I-Lan (TW); Bao-Shiang Sun, Hsin-Chu (TW); Henry Fan, Chung-Li (TW)

(73) Assignee: Holtek Semiconductor Inc. (TW)

( * ) Notice: Subject to any disclaimer, the term of this patent is extended or adjusted under 35 U.S.C. 154(b) by 853 days.

(21) Appl. No.: 08/843,786

(22) Filed: Apr. 21, 1997

(30) Foreign Application Priority Data

Dec. 12, 1996 (TW) ........................................ 85219291 U

(51) Int. Cl.$^7$ ............................................... G06F 11/00
(52) U.S. Cl. ...................................... 714/738; 365/195
(58) Field of Search .................. 365/201, 233, 365/222, 230.01, 195; 324/158 R, 73 R, 763; 327/589; 371/5.1, 22.1–4, 27.1, 22.5, 15.1; 307/465, 130; 395/183.06; 702/108, 120; 714/738, 718, 724; 361/86

(56) References Cited

U.S. PATENT DOCUMENTS

| | | | | |
|---|---|---|---|---|
| 4,827,476 A | * | 5/1989 | Garcia | 371/25 |
| 4,970,727 A | * | 11/1990 | Miyawaki et al. | 371/21.3 |
| 5,072,138 A | * | 12/1991 | Slemmer et al. | 307/465 |
| 5,077,738 A | * | 12/1991 | Larsen et al. | 371/15.1 |
| 5,142,688 A | * | 8/1992 | Harwood | 395/800 |
| 5,493,532 A | * | 2/1996 | McClure | 365/201 |
| 6,037,792 A | * | 3/2000 | McClure | 324/760 |

FOREIGN PATENT DOCUMENTS

| | | | | |
|---|---|---|---|---|
| EP | 0471544 | | 2/1992 | G11C/29/00 |
| EP | 0589553 | | 3/1994 | G06F/11/26 |
| EP | 0768676 | | 4/1997 | G11C/29/00 |
| SU | 1179375 | * | 9/1985 | G06F/15/46 |

* cited by examiner

Primary Examiner—Albert Decady
Assistant Examiner—Guy Lamarre
(74) Attorney, Agent, or Firm—Raymond Sun

(57) ABSTRACT

An integrated circuit is disclosed which includes a start test mode circuit for generating a test mode start-up signal to cause the integrated circuit to enter a test mode, and an automatic reset circuit responsive to the test mode start-up signal for preventing the integrated circuit from erroneously entering a test mode during normal operation.

17 Claims, 3 Drawing Sheets

APPARATUS WITHIN AN INTEGRATED CIRCUIT FOR PREVENTING THE INTEGRATED CIRCUIT FROM ERRONEOUSLY ENTERING A TEST MODE OPERATION

BACKGROUND OF THE INVENTION

1. Field of the Invention

The present invention relates to integrated circuits, and in particular, to a circuit within an integrated circuit for detecting the test mode operation of the integrated circuit, and for preventing the integrated circuit from erroneously entering the test mode.

2. Description of the Prior Art

An integrated circuit (IC) may be tested at various stages during the production and use of the IC. For example, tests may be performed following production to verify that the IC exhibits functional and parametric characteristics that conform to the specification for the IC.

To facilitate testing, it is common practice in prior art ICs to add one or more input and output (I/O) pins to the IC specifically for receiving test signals generated by an automatic test equipment during the test mode. However, additional I/O pins undesirably increase the size of the IC which results in increased packaging costs.

To overcome the above-referenced drawbacks, other prior art ICs have included a test mode detection circuit 12 in the IC 1, as shown in FIG. 1. The IC 1 has a normal mode operating circuit 11 having an I/O pin which is originally designed for I/O functions during normal operation of the IC 1. This I/O pin is multiplexed to receive a test mode start-up signal which will in turn be identified by the test mode detection circuit 12. Thus, the arrangement shown in FIG. 1 detects the modes of operation of the IC 1 without requiring additional pins.

Multiplexing functional pins to be used both as test mode input terminals and as functional input terminals still carries inherent disadvantages. The most significant drawback is that it is not uncommon for the IC to erroneously enter the test mode during normal operation of the IC due to unexpected noise or the like existing during the normal operation, or due to the rare malfunction of one or more circuit elements.

For purposes of this disclosure, "normal operation" shall mean the operation of the IC after it has been deployed for use in a particular system or circuit. "Normal operation" is contrasted with operation of the IC during production, when testing takes place. In light of the above-described drawback, it is desired that the test mode be entered only during production, and that safeguards are taken to prevent the IC from erroneously entering the test mode during normal operation of the IC.

Thus, there still remains a need for an IC which overcomes the drawbacks of the prior art ICs, and which prevents the IC from erroneously entering a test mode during normal operation of the IC.

SUMMARY OF THE DISCLOSURE

It is therefore an object of the present invention to provide an IC which obviates the need for extra input and output test pins for performing test operations.

It is a further object of the present invention to provide an IC which utilizes functional pins to input test mode triggering signals.

It is yet another object of the present invention to provide an IC which detects a test mode using an internal test mode detection circuit.

It is still another object of the present invention to provide an IC which employs an internal test mode detection circuit to identify test mode triggering signals which are input through functional pins.

It is a further object of the present invention to prevent an IC from erroneously entering a test mode during normal operation.

In order to accomplish the objects of the present invention, there is provided an IC including a start test mode circuit for generating a test mode start-up signal to cause the IC to enter a test mode, and an automatic reset circuit responsive to the test mode start-up signal for preventing the IC from erroneously entering a test mode during normal operation.

In one embodiment according to the present invention, the automatic reset circuit has a negative edge transition detector responsive to a negative edge of the test mode start-up signal for producing a system start-up driving signal, and a system start-up timer for producing a first reset signal to reset the IC in response to the system start-up driving signal, with the first reset signal exhibiting a delay with respect to the system start-up driving signal.

In one embodiment according to the present invention, the start test mode circuit includes a test triggering signal input terminal for receiving a test triggering signal, a data input terminal for receiving test data signal, a memory for storing a test data pattern, a comparator coupled to the memory and the data input terminal for comparing the test data signal and the test data pattern to produce a comparison signal, a D-type flip flop having a D input and coupled to the comparator for receiving the comparison signal, and an AND gate coupled to the Q output of the flip flop for generating the test mode start-up signal. The flip flop reproduces the comparison signal at its Q output to be sent to the AND gate after a predetermined time period.

The IC according to the present invention further includes another AND gate which is responsive to the test triggering signal and an inversion of the test mode start-up signal for generating a second reset signal to reset the IC during normal operation of the integrated circuit.

The present invention also provides a method for preventing an IC from erroneously entering a test mode, in which the IC includes a start test mode circuit for generating a test mode start-up signal to cause the IC to enter a test mode. The method includes the steps of detecting a negative edge of the test mode start-up signal, producing a system start-up driving signal responsive to the negative edge of the test mode start-up signal, and generating a first reset signal to reset the IC in response to the system start-up driving signal to reset the IC.

In one embodiment according to the present invention, the method further includes the step of delaying the generation of the first reset signal for a predetermined time period with respect to the system start-up driving signal.

The method according to the present invention further includes the step of prestoring a test data pattern which is distinctive from data signals that are expected to be input during normal operation. Another step according to the present invention is generating the test mode start-up signal upon locating a match between a test data pattern prestored in a memory in the start test mode circuit and a series of data signals input into the start test mode circuit.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known circuits and components are omitted so as to not obscure the description of the present invention with unnecessary detail.

Figure 1:
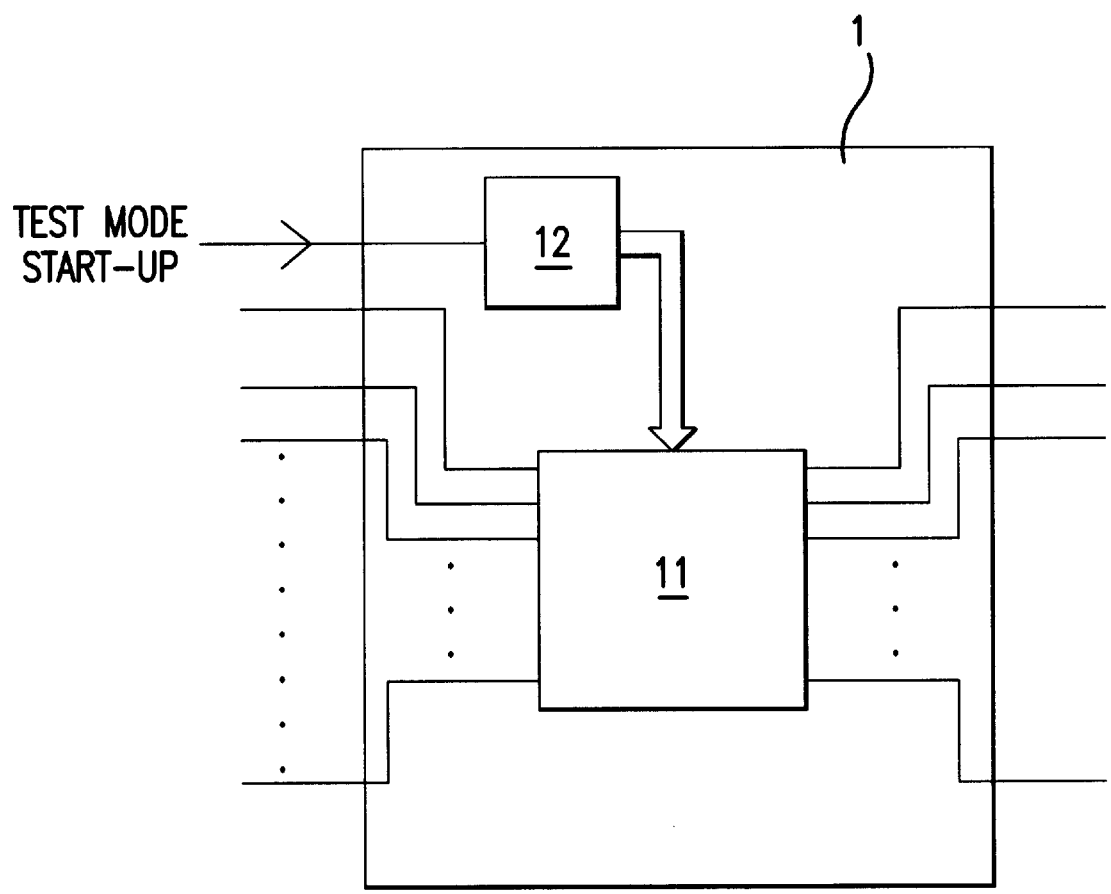
FIG. 1 is a schematic block diagram of a prior art IC having an internal test mode detection circuit.
Figure 2:
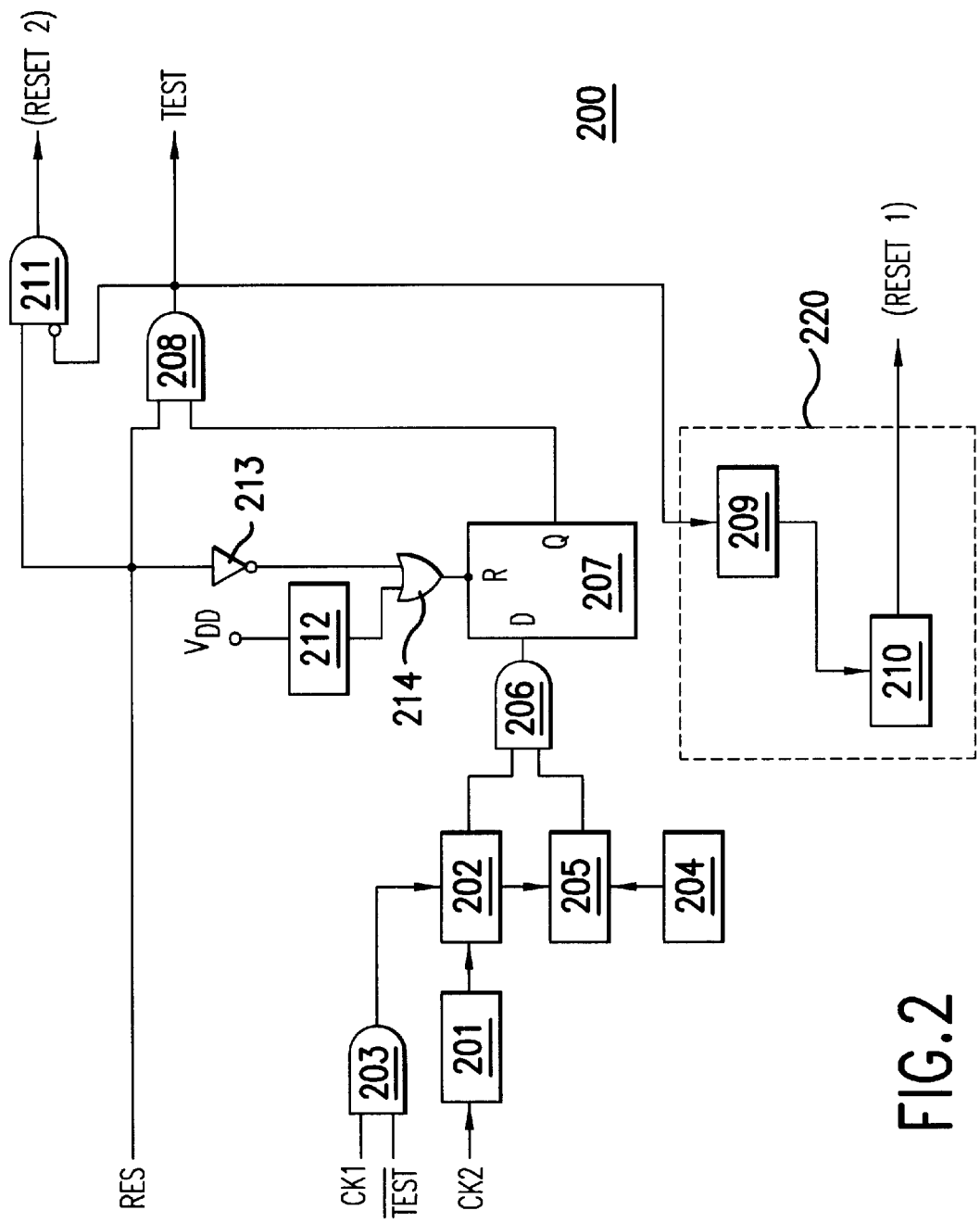
FIG. 2 is a schematic block diagram of an IC with an internal test mode detection circuit in accordance with an embodiment of the present invention.
Figure 3:
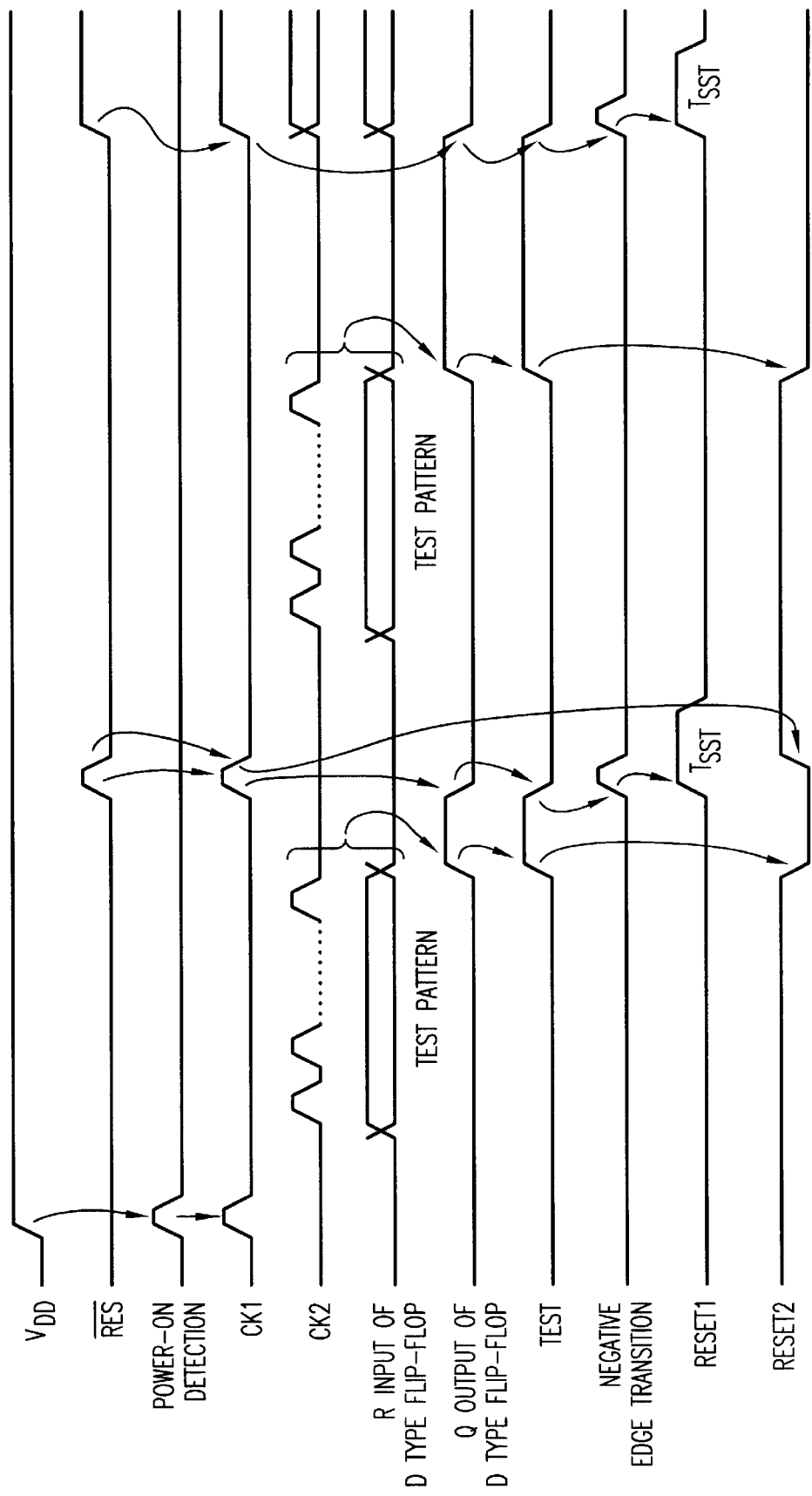
FIG. 3 is a timing diagram illustrating the signal waveforms for the IC of FIG. 2.

FIG. 2 illustrates an internal test mode detection circuit 200 according to an embodiment of the present invention. A system clock input pin CK1, a system clock output pin CK2, and a system reset input pin RES of a conventional IC are employed as test signal input terminals. System reset input pin RES is used as the test triggering signal input terminal. During production of the IC, RES is normally kept at a high level. However, when the IC is in use during normal operation, RES is normally kept at a low level, except that a one-shot pulse of a logic-high or high level is applied to the pin RES when the IC is reset during normal operation.

To activate the test mode detection circuit during production of the IC, a power-on detector 212 receives a voltage $V_{DD}$ supplied from an external power source. Power-on detector 212 applies a one-shot pulse of a logic-high or high level to the R-input of a D-type flip flop (FF) 207 to reset the Q output of the FF 207 to output a low level signal.

After the high level pulse is applied to FF 207, data signals are input in series into a gate delay 201 through system clock output pin CK2. An AND gate 203 couples a write enable signal from the system clock input pin CK1 and an inverted test enable signal. The signals from the system clock input pin CK1 are a series or string of clock signals. Thus, the output of AND gate 203 operates to activate a shift register (SR) 202 to shift a series of data signals from gate delay 201.

A memory device 204, such as a read-only memory (ROM) or a programmable read-only memory (PROM), is used to prestore a test data pattern. When it is desired to cause the IC to enter the test mode during production, a data pattern corresponding to the test data pattern is input into gate delay 201. The data signals from gate delay 201 are registered in SR 202. A comparator 205 then compares the data pattern in SR 202 with the prestored test data pattern in memory 204. The comparator 205 will output a "High" or "Low" signal indicative of a "match" or "mismatch", respectively, between the data patterns in SR 202 and memory 204. A "match" or "High" output from comparator 205 therefore acts to trigger the test mode for this IC. As a result, as one safeguard for preventing the IC from erroneously entering the test mode during normal operation, it is preferable to prestore a test data pattern in memory 204 that is very different from the usual data patterns that are received at CK1 and CK2 during normal operation.

The data from SR 202 and the output of comparator 205 are provided as inputs to an AND gate 206. The output of AND gate 206 is provided to the D-input of FF 207. After a predetermined time delay that is inherent in the FF 207, the D input is represented at the Q output of the FF 207. A system reset signal provided by the RES input terminal, and the Q output of the FF 207, are provided as inputs to an AND gate 208 to generate a test enable, or test mode triggering, signal TEST. Since RES is normally kept at a high level during production, a high level signal from the Q output of the FF 207 will cause the AND gate 208 to produce a high level output representing the test enable signal TEST. The high level of the TEST signal causes the inverted TEST signal to go low, thereby preventing the SR 202 from accepting any further data. The TEST signal is used to cause the IC to enter a test mode.

When it is desired for the IC to exit the test mode during production, RES is caused to go low, which in turn causes the AND gate 208 to output a low level TEST signal. The low level TEST signal causes the inverted TEST signal to go high, thereby allowing the SR 202 to begin accepting data patterns from gate delay 201. This is continued until it is desired for the IC to enter the test mode again, at which time a data pattern corresponding to the prestored test data pattern in memory 204 is input through gate delay 201.

Since RES is usually at a low level during normal operation, AND gate 208 will usually output a low level TEST signal during normal operation so that the test mode will usually not be entered during a normal operation.

The IC is reset during normal operation in the following manner. Since RES is usually at a low level during normal operation, a one-shot pulse of a high level signal is applied to the pin RES. When RES returns to its normal low level, inverter 213 and OR gate 214 will reset FF 207 to output a low level signal from its Q output. The low level signal from the Q output of FF 207 will cause the TEST signal from AND gate 208 to remain at a low level during the reset period. The low level TEST signal is applied to an inverted input of AND gate 211, which when coupled with the instantaneous high level RES signal, will generate a RESET2 signal for resetting the IC. This circuit arrangement therefore realizes the advantage of multiplexing functional pins for multiple purposes.

Another safeguard for preventing the IC from erroneously entering the test mode during normal operation is provided by the arrangement of the RES signal, the inverter 213, and the FF 207. Since RES is usually at a low level during normal operation, the R-input of FF 207 will be maintained at a high level during normal operation, and consequently, the Q-output of FF 207 will remain low thereby causing the output of AND gate 208 to remain low.

Unfortunately, it is possible that, when RES goes "high" to reset the IC as described in the previous paragraph, the Q output of FF 207 produces a high level signal. This can be caused by noise or the like in the environment, or by an inadvertent malfunction of the FF 207 or any of the other circuit elements. As a result, the TEST signal goes high, so that a test mode is erroneously entered without resetting the IC (since RESET2 will be at a low level).

The present invention provides an automatic reset circuit 220 for preventing the IC from erroneously entering the test mode during normal operation. The automatic reset circuit 220 includes a negative edge transition detector 209 and a system start-up timer 210 which operates in the following manner. When RES returns to its normal low level after its one-shot high signal, the TEST signal goes low, and this low level signal is detected by the negative edge detector 209. In response to the change of the logic level of the TEST signal from high to low, negative edge detector 209 generates a system start-up driving signal to start up system start-up timer 210, which can be a counter. The timer 210 counts a predetermined time delay to allow the system oscillator to stabilize, after which it generates a RESET1 signal to reset the IC. This also occurs when the IC switches from the test mode into normal operation.

Thus, the automatic reset circuit 220 operates to provide an automatic reset signal RESET1 every time the TEST signal goes from high to low, so that the IC is reset by the RESET1 signal even if the RESET2 signal is erroneously not provided. Resetting the IC will prevent the IC from entering the test mode.

Those skilled in the art will appreciate that the test mode detection circuit 200 actually provides three safeguards for preventing the IC from erroneously entering the test mode during normal operation. The first safeguard is provided by prestoring a unique and distinctive data pattern in memory 204, so that the comparator 205 will be less likely to cause the FF 207 to generate a test enable signal TEST. The second safeguard is provided by the arrangement of the normally-low level RES signal, the inverter 213, and the FF 207, which generally causes the AND gate 208 to output a low-level signal during normal operation. The third safeguard is provided by the automatic reset circuit 220. The provision of these three safeguards makes it very difficult for the IC to erroneously enter the test mode during normal operation, while providing the benefits of an IC having multiplexed pins for accomplishing its test mode operation.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. An integrated circuit comprising a test mode detection circuit, the test mode detection circuit comprising:
    a test triggering signal input terminal for receiving a test triggering signal;
    a data input terminal for receiving test data signals;
    a memory for storing a test data pattern;
    a comparator coupled to the memory and the data input terminal for comparing the test data signal and the test data pattern to produce a comparison signal;
    a first AND gate coupled to the data input terminal and the comparator for generating the comparison signal;
    a D-type flip flop having a D input and coupled to the first AND gate for delaying the comparison signal and for reproducing the comparison signal at its Q output after a predetermined time period; and
    a second AND rate coupled to the Q output of the flip flop for generating a test mode start-up signal to cause the integrated circuit to enter a test mode.

2. The integrated circuit of claim 1, wherein the test mode detection circuit further comprises a third AND gate which is responsive to the test triggering signal and an inversion of the test mode start-up signal for generating a second reset signal during normal operation of the integrated circuit.

3. The integrated circuit of claim 2, wherein the test triggering signal input terminal is a reset input terminal of the integrated circuit.

4. The integrated circuit of claim 1, wherein the test mode detection circuit further comprises a reset circuit for resetting the integrated circuit after the integrated circuit has erroneously entered a test mode.

5. The integrated circuit of claim 4, wherein the automatic reset circuit comprises:

a negative edge transition detector responsive to a negative edge of the test mode start-up signal for producing a system start-up driving signal; and
    a system start-up timer for producing a first reset signal in response to the system start-up driving signal, the first reset signal exhibiting a delay with respect to the system start-up driving signal.

6. The integrated circuit of claim 1, wherein the data input terminal for receiving the test data signal is an output pin for system clock signals of the integrated circuit.

7. The integrated circuit of claim 1, wherein the test mode detection circuit further comprises:
    a power-on detector for receiving a voltage supply from an external power source;
    an inverter which inverts the test triggering signal; and
    an OR gate coupled to the flip flop and responsive to the power-on detector and the inverter for resetting the flip flop.

8. The integrated circuit of claim 1, wherein the test mode detection circuit further comprises:
    a shift register for storing the test data signal and coupled to the comparator;
    a write enable input terminal for receiving write enable signals; and
    a fourth AND gate coupled to the write enable signal and responsive to an inversion of the test mode start-up signal to cause the shift register to accept the test data signals.

9. The integrated circuit of claim 8, wherein the write enable signal input terminal is a pin for inputting system clock signals of the integrated circuit.

10. The integrated circuit of claim 8, wherein the test mode detection circuit further comprises a gate delay coupled to the shift register for delaying the test data signals for a predetermined time before they are received at the shift register.

11. An integrated circuit, comprising:
    a start test mode circuit for generating a test mode start-up signal to cause the integrated circuit to enter a test mode; and
    a reset circuit coupled to the start test mode circuit and responsive to the test mode start-up signal for resetting the integrated circuit after the integrated circuit has erroneously entered a test mode during normal operation.

12. The integrated circuit of claim 11, wherein the automatic reset circuit comprises:
    a negative edge transition detector responsive to a negative edge of the test mode start-up signal for producing a system start-up driving signal; and
    a system start-up timer for producing a first reset signal in response to the system start-up driving signal, the first reset signal exhibiting a delay with respect to the system start-up driving signal.

13. The integrated circuit of claim 12, wherein the start test mode circuit comprises:
    a test triggering signal input terminal for receiving a test triggering signal;
    a data input terminal for receiving test data signal;
    a memory for storing a test data pattern;
    a comparator coupled to the memory and the data input terminal for comparing the test data signal and the test data pattern to produce a comparison signal;
    a D-type flip flop having a D input and coupled to the comparator for receiving the comparison signal, the flip flop reproducing the comparison signal at its Q output after a predetermined time period; and a first AND gate coupled to the Q output of the flip flop for generating the test mode start-up signal.

14. The integrated circuit of claim 13, further comprising a second AND gate which is responsive to the test triggering signal and an inversion of the test mode start-up signal for generating a second reset signal during normal operation of the integrated circuit.

15. A method for protecting an integrated circuit against the consequences of having erroneously entering a test mode during normal operation, in which the integrated circuit comprises a start test mode circuit for generating a test mode start-up signal to cause the integrated circuit to enter a test mode, wherein the method comprises the steps of:

(a) generating a test mode start-up signal during normal operation of the integrated circuit; and (b) resetting the integrated circuit based on the receipt of the test mode start-up signal.

16. The method of claim 15, wherein step (b) further includes:

resetting the integrated circuit a predetermined time after the receipt of the test mode start-up signal.

17. The method of claim 15, further including:

(a1) detecting a negative edge of the test mode start-up signal;

(a2) responsive to the negative edge of the test mode startup signal, counting a predetermined time delay; and (a3) generating a first reset signal after the predetermined time delay so as to reset the integrated circuit.

* * * * *